(12) United States Patent
Kawata et al.

(10) Patent No.: US 7,291,385 B2
(45) Date of Patent: Nov. 6, 2007

(54) CONDUCTIVE FILM AND METHOD FOR PREPARING THE SAME

(75) Inventors: Ken Kawata, Kanagawa (JP); Akihiko Koshika, Tokyo (JP)

(73) Assignee: Fujifilm Corporation, Tokyo (JP)

( * ) Notice: Subject to any disclaimer, the term of this patent is extended or adjusted under 35 U.S.C. 154(b) by 261 days.

(21) Appl. No.: 10/911,577

(22) Filed: Aug. 5, 2004

(65) Prior Publication Data

US 2005/0040535 A1    Feb. 24, 2005

(30) Foreign Application Priority Data

Aug. 5, 2003    (JP)    ............ P. 2003-286837

(51) Int. Cl.
*B32B 5/16*    (2006.01)
(52) U.S. Cl. ............................ 428/323
(58) Field of Classification Search ............ None
See application file for complete search history.

(56) References Cited

U.S. PATENT DOCUMENTS

| 4,629,684 A | * | 12/1986 | Sato et al. ............ 430/559 |
| 4,835,272 A | * | 5/1989 | Sato et al. ............ 544/158 |
| 4,927,897 A | * | 5/1990 | Kawata et al. ............ 526/240 |
| 5,055,537 A | * | 10/1991 | Kawata et al. ............ 526/240 |
| 6,120,586 A | * | 9/2000 | Harada et al. ............ 106/1.25 |

FOREIGN PATENT DOCUMENTS

| JP | 63-126297 A | | 5/1988 |
| JP | 01-104782 A | | 5/1989 |
| JP | 4-148590 A | | 5/1992 |
| JP | 10-146915 A | | 6/1998 |
| JP | 10-261870 A | | 9/1998 |
| JP | 2000-141542 A | | 5/2000 |
| JP | 2000-309898 A | | 11/2000 |
| JP | 2001-68804 A | | 3/2001 |
| JP | 2001154215 A | * | 6/2001 |
| JP | 2005054240 A | * | 3/2005 |

* cited by examiner

*Primary Examiner*—David E. Graybill
(74) *Attorney, Agent, or Firm*—Sughrue Mion Pllc.

(57) ABSTRACT

A conductive film comprising: a support; a particle-containing layer; and a metal thin film layer, in this order, wherein the particle-containing layer contains particles having a mean particle size of from 1 to 10 μm and a heat decomposed material of a metal acetylide and has irregularities derived from a shape of the particles formed on a surface thereof, and the metal thin film layer contains a metal element.

11 Claims, 1 Drawing Sheet

CONDUCTIVE FILM AND METHOD FOR PREPARING THE SAME

FIELD OF THE INVENTION

The present invention relates to a conductive film and a method of preparing the same. Also, the invention relates to a process of producing a multilayered printed wiring board using a conductive film.

BACKGROUND OF THE INVENTION

In recent years, the flow of reduction in size and weight and high performance of electronic instruments rapidly advances. For this reason, it is also required to make electronic parts to be used in an electronic instrument small in size. In order to cope with this, realization of a high density of printed wiring board becomes a big problem. The layer structure of a multilayered printed wiring board has a structure in which a planar conductive layer (wiring pattern) and an insulating layer are alternately laminated. Lamination of such a wiring pattern is advantageous in realizing a high density.

Hitherto, a 50 μm-thick rolled copper foil has been used because it is cheap and good in handling property. Following the high density of a wiring pattern, a 35 μm-thick rolled copper foil has also been recently provided. Further, though the film thickness of not more than 10 μm is demanded, it is the actual situation that it is likely difficult from the standpoints of handling property and operability to provide a copper thin film having such a film thickness by a pressure roll.

Then, in place of the rolled copper foil, there is developed a system in which an extremely thin conductive layer is formed on a resin film by the sputtering or electroless plating method, a copper thin film of about 10 μm is formed by cheap electrolytic copper plating, and this copper thin film is then transferred onto a substrate. This technology of forming a copper thin film on a resin film is a technique that is widely employed for flexible printed wiring boards or thin film copper films for TAB (tape automated bonding) tapes. Recently, this technology is also applied as a technique in which a copper thin film can be cheaply and simply formed and transferred onto a desired substrate to produce a multilayered printed wiring board.

In the multilayered printed wiring board, with respect to a conventional technique of insulating layer prepregs partitioning the planar conductive layer, there is generated a technical problem because of its high density. Hitherto, connection (that is, interlaminar connection) of upper and lower circuit patterns (conductive layers) has been carried out by forming a via hole (forming a hole on an insulating layer) by drilling and forming a metal plating in that portion. However, the formation of a via hole by such drilling is difficult in making the size of the via hole small and is not suitable for realizing a high density.

On the other hand, as one method of realizing a high density of printed wiring board, the build-up method is recently watched. Its characteristic feature resides in the matter that the formation of a hole for interlaminar connection is carried out by forming a fine hole (via hole) between the layers using a photosensitive insulating film in place of the conventional drilling method.

For example, a specific example of the method of forming interlaminar connection by a via hole of this photosensitive insulating film is described in JP-A-4-148590. In this method, a photosensitive insulating resin layer is provided on a first circuit pattern having a wiring pattern of a copper layer formed on a substrate, a via hole is formed by photolithography (imagewise exposure and development), and its surface is then subjected to a chemical roughing treatment with a potassium permanganate solution. In this case, the chemical roughing treatment is carried out for the purpose of enhancing an adhesive strength between the insulating resin layer and an electroless plated copper layer (and an electrolytically plated copper layer formed thereon). It is considered that fine irregularities are formed on the resin surface, whereby the adhesive strength is enhanced due to a so-called anchor effect. Copper is attached onto the insulating resin layer having a via hole formed thereon by electroless plating. In this way, copper is also attached onto the via hole and the first circuit pattern (copper layer) in the bottom of the via hole, whereby a copper layer for forming a second circuit pattern to be connected to a first wiring pattern is formed. This copper layer is patterned to form a second wiring pattern. Then, the desired number of wiring patterns can be formed in the same way.

However, according to the method described in JP-A-4-148590, that is, the method of forming irregularities on the surface of the insulating resin layer by a chemical treatment (surface roughing treatment), since the use of potassium permanganate that may possibly adversely affect the environment is essential in forming irregularities on the surface, such a method is not preferable in view of safety or environment.

On the other hand, for the sake of enhancing the adhesive strength between an insulating resin layer and an electroless plated copper, JP-A-63-126297 describes a method in which particles soluble in an acid or an oxidizing agent solution are dispersed in a photosensitive insulating resin, and after curing the photosensitive insulating resin, the dispersed particles are dissolved with a specific chemical (oxidizing agent) made of chromic acid, a chromate, a permanganate, ozone, etc. to form irregularities on the surface of the photosensitive insulating resin layer, thereby enhancing the adhesive strength to e metal film by means of electroless plating.

However, even this disclosed method is not preferable in view of safety or environment because the treating agent to be used is an oxidizing agent or a strong acid. Further, according to this method, though the particle-containing photosensitive insulating resin layer is formed by coating, in the case where the particle-containing photosensitive insulating resin layer is provided on an insulating substrate in the lamination (thermo-compression bonding) system that is simple in works of the step and less with respect to defects in the formed layer in comparison with printing or coating, since the particles are dispersed in the photosensitive insulating resin, defects such as incorporation of bubbles onto the insulating substance are liable to be caused, resulting in a problem of difficulty from the standpoint of practical use.

In order to cope with these technical demands, there is developed a technique of forming a previously roughed thin film metal layer and releasing and transferring it. For example, JP-A-2000-309898 and JP-A-2001-68804 disclose that for the purpose of enhancing the release property between a support and a transfer metal thin film, a specific compound such as thiocyanuric acid and nitrogen-containing organic compounds is used in a joining interface. JP-A-10-146915 discloses an adhesive-attached copper foil obtaining by continuously coating a curable resin composition that is cured by heat or active energy rays and heat on a surface-treated extremely thin copper foil having been temporarily adhered onto a carrier and optionally subjecting to B-stage curing (semi-curing) with heat. JP-A-10-261870 discloses a material for multilayered printed wiring board by the build-up method in which an insulating adhesive layer in the semi-cured state is provided on the roughed metal foil surface.

Further, JP-A-2000-141542 discloses a copper foil comprising a resin film having an electroless copper-plated layer and a roughed electrolytically copper-plated layer laminated in this order on the surface thereof. However, in order to impart good adhesion to an insulating layer in the next step, it is essential to perform a roughing step in the side coming into contact with the support. A technique for realizing not only good release property but also cheap, simple and good adhesion has been demanded.

SUMMARY OF THE INVENTION

The invention is aimed to provide a release type conductive film obtained by forming simply and cheaply a metal thin film layer on a resin support and capable of obtaining good transfer property of the metal thin film layer and good adhesion between adjacent layers and a method of preparing the same. Further, the invention is aimed to provide a film having plating catalytic activity, comprising a support having thereon a localized fine metal or fine metal-containing layer on the surface of which fine irregularities are formed, and a metal thin film having a specific mean surface roughness. Moreover, the invention is aimed to provide a cheap process of producing a multilayered printed wiring board in which a cheap resin support can be chosen as a support for forming a metal thin film layer. In particular, the invention is aimed to provide a process of producing a multilayered printed wiring board in which by adequately roughing the both surfaces of a metal thin film layer to be transferred, it does not cause environmental pollution due to the conventional chemical treatment, and a good adhesive strength between adjacent insulating layers after transfer through simple and safe works.

Means for solving the foregoing problems are as follows.

<1> A conductive film comprising a support having thereon a particle-containing layer, the particle-containing layer containing at least particles having a mean particle size of from 1 to 10 μm and a heat decomposed material of a metal acetylide and having fine irregularities derived from the particle shape formed on the surface thereof, and a metal thin film layer in that order.

<2> The conductive film as set forth in <1>, wherein the particle-containing layer further contains water and a water-soluble or soluble resin.

<3> The conductive film as set forth in <1> or <2>, wherein the metal thin film layer is formed by electroless plating or electrolytic plating.

<4> The conductive film as set forth in any one of <1> to <3>, wherein the metal element contained in the metal thin film layer is any one metal element selected from the group consisting of silver, gold, platinum, copper, aluminum, nickel, palladium, cobalt, and chromium.

<5> The conductive film as set forth in any one of <1> to <4>, wherein the metal element contained in the metal thin film layer is copper.

<6> The conductive film as set forth in any one of <1> to <5>, wherein the metal acetylide is a compound obtained by reaction of a compound represented by the following formula (I) and a metal element.

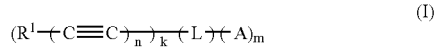

(I)

In the formula, A represents a polyoxyether group, a polyaminoether group, or a polythioether group; $R^1$ represents a hydrogen atom, a carboxyl group or a salt thereof, an alkyl group, a cycloalkyl group, an alkenyl group, an alkynyl group, an aryl group, an aralkyl group, or a heterocyclic group; L represents a chemical bond of connecting a carbon-carbon triple bond to A or a group having a (k+m) valence; k and n each presents an integer of 1 or more; and m represents an integer of 0 or more.

<7> The conductive film as set forth in any one of <1> to <6>, wherein the support has a short-term heat resistant temperature of 150° C. or higher.

<8> The conductive film as set forth in any one of <1> to <7>, wherein the support is polyethylene terephthalate.

<9> The conductive film as set forth in any one of <1> to <8>, wherein the surface of the metal thin film layer is roughed.

<10> A method of preparing a conductive film including a first step of coating a coating solution containing particles having a mean particle size of from 1 to 10 μm and a metal acetylide on a support and heat treating it to obtain a film in which a fine metal derived from the metal acetylide is localized on the surface thereof, and the surface having fine irregularities derived from the particle shape is formed; and a second step of subjecting the film obtained in the first step to electroless plating or at least bringing it into contact with a solution containing a hydrohalogenic acid or an ion of any one metal element selected from the metal element group selected from palladium, tin, gold, platinum, and silver to impart conductivity.

<11> The method of preparing a conductive film as set forth in <10>, further including a third step of forming a metal thin film layer on the film surface having been imparted conductivity by the second step by electroless plating with the film surface having been imparted conductivity being a plating nucleus.

<12> The method of preparing a conductive film as set forth in <10>, further including a third step of forming a metal thin film layer on the film surface having been imparted conductivity by the second step by electrolytic plating directly on the film surface having been imparted conductivity.

<13> The method of preparing a conductive film as set forth in <12>, wherein the electrolytic plating step is carried out via a roughing step.

<14> A film having plating catalytic activity, comprising a support having thereon a particle-containing layer, the particle-containing layer containing at least particles having a mean particle size of from 1 to 10 μm and a heat decomposed material of a metal acetylide and having fine irregularities derived from the particle shape formed on the surface thereof, wherein a fine metal derived from the metal acetylide is localized in the surface side of the particle-containing layer.

<15> The film having plating catalytic activity as set forth in <14>, wherein the localized fine metal is silver.

<16> A metal thin film containing a metal element selected from the group consisting of silver, gold, platinum, copper, aluminum, nickel, palladium, cobalt, and chromium and having a ten-point mean surface roughness Rz of not more than 4.0 μm on at least one surface thereof.

<17> A printed wiring board comprising a substrate having thereon an insulating layer and a metal thin film layer in that order, the metal thin film containing a metal element selected from the group consisting of silver, gold, platinum, copper, aluminum, nickel, palladium, cobalt, and chromium and having a ten-point mean surface roughness Rz of not more than 4.0 μm on at least one surface thereof.

According to the invention, it is possible to provide a conductive film having a good conductive performance, which can be prepared by simple steps. Also, according to the invention, it is possible to provide a process of producing stably a conductive film having a good conductive performance by simple steps and at low costs. Further, the conductive film of the invention can be used for an internal layer of a multilayered printed wiring board.

DETAILED DESCRIPTION OF THE INVENTION

The invention will be described below in detail.

Figure 1:
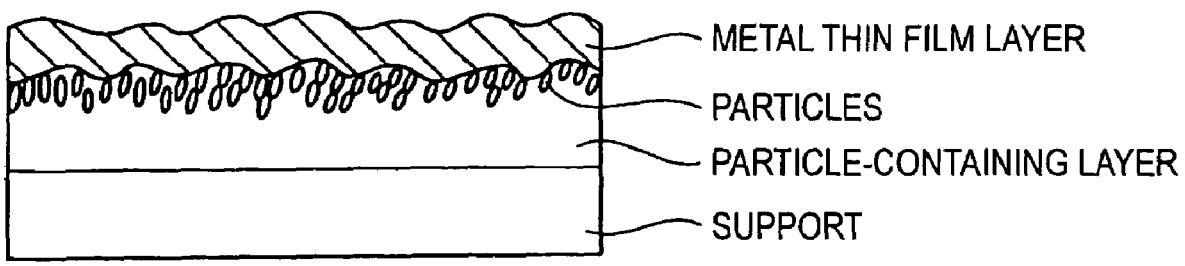
[FIG. 1] is an outline cross-sectional view to schematically show an example of the layer construction of the conductive film of the invention.

The conductive film of the invention comprises a support having thereon a particle-containing layer, the particle-containing layer containing at least particles having a mean particle size of from 1 to 10 μm and a heat decomposed material of a metal acetylide and having fine irregularities derived from the particle shape formed on the surface thereof, and a metal thin film layer in that order. An outline cross-sectional view of an example of the layer construction of the foregoing conductive film of the invention is shown in FIG. 1.

Next, the construction of the conductive film of the invention will be described below in detail.

As a support to be used in the invention, plastic films such as a polyethylene terephthalate film can be used. Since the support is required to be resistant to the heat treatment at the time of forming a particle-containing layer, the high-molecular film to be used as the support is preferably one having a short-term heat resistant temperature of 150° C. or higher. The term "short-term heat resistant temperature" as referred to herein means a glass transition temperature (Tg) in amorphous polymers and (Tm—50° C.) (wherein Tm represents a melting point (° C.)) in crystalline polymers, respectively.

In the invention, as the support, high-molecular films selected from the group consisting of polyethylene terephthalate (PET), polyethylene naphthalate (PEN), polycarbonates (PC), polyimides (PI), and polyether-ether ketones (PEEK) are preferable; polyethylene terephthalate and polyimides are more preferable; and polyethylene terephthalate is especially preferable.

It is preferable in view of handling property and resolution that the support has a thickness of from 10 to 200 μm. Further, taking into consideration the follow-up property onto the surface of an insulating substrate at the time of lamination on the substrate, it is more preferable that the support has a thickness of from 10 to 100 μm.

In the invention, a particle-containing layer is provided on the support.

The particle-containing layer contains at least particles having a mean particle size of from 1 to 10 μm and a metal acetylide as essential components.

As the particles, any particles such as inorganic particles, organic low-molecular particles, and organic high-molecular particles are employable so far as they have a mean particle size of from 1 to 10 μm.

Preferred examples of the particles include silica, calcium silicate, calcium carbonate, zinc oxide, titanium dioxide, zirconia, mullite, calcium hydroxide, talc, aluminum hydroxide, diatomaceous earth, and barium sulfate. Of these, calcium carbonate is especially preferable. These particles can be used singly or in combinations of the plural number of particles.

The mean particle size of the particles is especially preferably in the range of from 1 to 7 μm. Incidentally, though in the invention, the particle size of the particles is in general expressed by a mean particle size, in the case where particles that are liable to cause coagulation, such as ultra-fine silica, are present in the coagulated state within a layer, a mean coagulated particle size (mean secondary particle size) is expressed as the mean particle size.

In the invention, it is possible to contain a metal acetylide in the particle-containing layer by dispersing and/or dissolving a monomer having a carbon-carbon triple bond and a metal compound having a metal element in a prescribed solvent, or by dispersing and/or dissolving a previously formed metal acetylide in a prescribed solvent.

As the foregoing monomer having a carbon-carbon triple bond, a compound represented by the following formula (I) is preferable.

(I)

In the foregoing formula (I), A represents a polyoxyether group, a polyaminoether group, or a polythioether group; $R^1$ represents hydrogen, a carboxyl group or a salt thereof, an alkyl group, a cycloalkyl group, an alkenyl group, an alkynyl group, an aryl group, an aralkyl group, or a heterocyclic group; L represents a chemical bond of connecting a carbon-carbon triple bond to A or a group having a (k+m) valence; k and n each presents an integer of 1 or more; and m represents an integer of 0 or more.

In the foregoing formula (I), A may be further substituted with a hydroxyl group, an amino group, a mercapto group, a sulfino group or a salt thereof, a sulfo group or a salt thereof, a carboxyl group or a salt thereof, or a polymerizable group. Examples of the foregoing polymerizable group include an acryloyl group, a glycidyl group, a vinyl group, and an isocyanate group.

In the foregoing formula (I), RF represents hydrogen, a carboxyl group or a salt thereof, an alkyl group, a cycloalkyl group, an alkenyl group, an alkynyl group, an aryl group, an aralkyl group, or a heterocyclic group. In the foregoing formula (I), as the alkyl group represented by $R^1$, an alkyl group having from 1 to 10 carbon atoms is preferable, and the alkyl group may be linear or branched. Also, as the cycloalkyl group represented by $R^1$, a cycloalkyl group having from 5 to 6 carbon atoms is preferable. As the alkenyl group represented by $R^1$, an alkenyl group having from 2 to 10 carbon atoms is preferable, and the alkenyl group may be linear or branched. As the alkynyl group represented by $R^1$, an alkynyl group having from 2 to 10 carbon atoms is preferable, and the alkynyl group may be linear or branched. As the aryl group represented by $R^1$, an aryl group having from 6 to 10 carbon atoms is preferable. As the aralkyl group represented by $R^1$, an aralkyl group having from 7 to 10 carbon atoms is preferable. As the heterocyclic group represented by $R^1$, a 5-membered to 6-membered heterocyclic group containing a nitrogen atom, a sulfur atom, an oxygen atom, etc. is preferable. Each of the alkyl group, cycloalkyl group, alkenyl group, alkynyl group, aryl group, aralkyl group, and heterocyclic group represented by $R^1$ may be substituted, and examples of the substituent include a hydroxyl group, an acetyl group, an epoxy group, a carboxyl group, and a sulfonic group.

In the foregoing formula (I), L represents a chemical bond of connecting a carbon-carbon triple bond to A or a group having a (k+m) valence. For example, L represents an alkylene group, an aryl group, an aralkylene group, a vinylene group, a cycloalkylene group, a glutaroyl group, a phthaloyl group, a hydrazo group, an ureylene group, a thio group, a carbonyl group, an oxy group, an imino group, a sulfinyl group, a sulfonyl group, a thiocarbonyl group, an oxazolyl group, or an azo group, each of which may be substituted. Also, L may be a group of any combination of two or more groups of the foregoing groups. Incidentally, L may be further substituted with a variety of substituents. As the substituent, those enumerated as the substituent of A are enumerated.

In the foregoing formula (I), k and n each represents an integer of 1 or more. It is preferable that k represents an integer of from 1 to 4 and that n represents an integer of from 1 to 2. Also, in the foregoing formula (I), m represents an integer of 0 or more, and especially preferably an integer of from 1 to 3.

With respect to the compound represented by the foregoing formula (I), Illustrative Compounds (1) to (16) will be given below as specific examples, but it should not be construed that the invention is limited thereto.

(1)

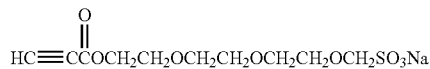
(2)

(3)

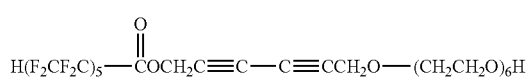
(4)

(5)

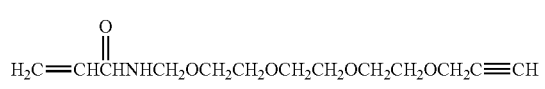
(6)

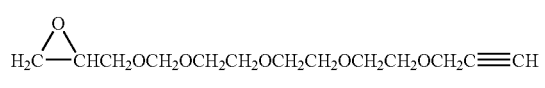
(7)

(8)

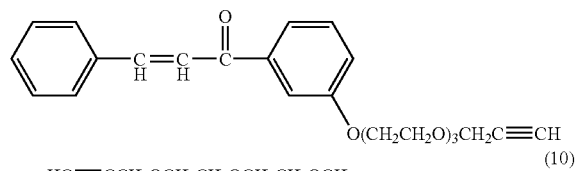
(9)

$HC{\equiv}CCH_2OCH_2CH_2OCH_2CH_2OCH_3$ (10)

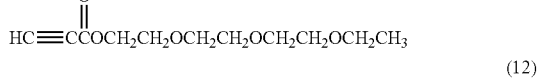
(11)

(12)

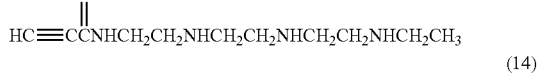
(13)

(14)

(15)

$HC{\equiv}CCH_2OCH_2CH_2OCH_2CH_2OCH_2CH_2OCH_2C{\equiv}CH$ (16)

Monomers of these acetylene compounds can be in general synthesized in the following manner. That is, a compound having a carbon-carbon triple bond, such as propiolic acid, propargyl bromide, and propargyl alcohol, may be condensed with other necessary functional group-containing compound such as tetraethylene glycol monoethyl ether, maleic anhydride, propanesultone, epichlorohydrin, and acrylic chloride. Above all, Illustrative Compound (I) is preferable as the monomer having a carbon-carbon triple bond. An example of the synthesis represented by the formula (I) will be enumerated below.

Synthesis of Illustrative Example (1):

A mixture of 107 g of triethylene glycol monoethyl ether, 107 g of propargyl bromide, and 300 g of anhydrous potassium carbonate is heated and stirred for 20 hours on a water bath. After cooling, insoluble matters are filtered out through sellaite, and the filtrate is distilled in vacuo to obtain a colorless transparent liquid having a boiling point of 115° C./0.6 mmHg in a yield of 120 g.

Other compounds can also be easily synthesized in a similar manner.

As the metal element constructing the metal acetylide, any one of elements selected from the groups 8 to 11 of the periodic table of elements is preferable. Examples of elements of the groups 8 to 11 of the periodic table include nickel, ruthenium, rhodium, palladium, platinum, copper, aluminum, silver, and gold. Of these, silver, gold, platinum, copper, aluminum, nickel, and palladium are preferable, and silver and copper are more preferable as the metal element. Also, the foregoing elements may be used alone or in combinations of two or more kinds thereof. It is preferable that the foregoing metal element is used in the form of a metal salt or metal complex in preparing a coating solution. Examples of the foregoing metal salt include silver nitrate, silver acetate, silver tetrafluoroborate, palladium chloride, cuprous chloride, and platinum chloride. Examples of the metal complex include a di-μ-chlorobis(η-2-methylallyl)- dipalladinite(II) complex, a tetrakis(triphenylphosphine)palladium complex, a di-µ-chlorotetracarbonyldirhodium(I) complex, a 1,4,7,10,13-pentaoxycyclododecane sodium tetrachloro-vanadium, and dicyclopentadiene-gold(I) chloride. Incidentally, the foregoing metal salt and/or metal complex of the metal element may be contained in the coating solution, too.

As the metal acetylide that can be used in the invention, a compound represented by the following formula (II) is especially preferable.

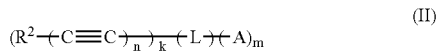

$$(R^2+(C\equiv C)_n)_k+(L)_r(A))_m \quad (II)$$

In the foregoing formula (II), A represents a polyoxyether group, a polyaminoether group, or a polythioether group; $R^2$ represents a metal element; L represents a chemical bond of connecting a carbon-carbon triple bond to A or a group having a (k+m) valence; k and n each presents an integer of 1 or more; and m represents an integer of 0 or more. In the foregoing formula (II), A, L, k, n, and m are each synonymous with those in the foregoing formula (I), and preferred examples thereof are also the same.

Examples of the metal element represented by $R^2$ include elements belonging to the group 1 (alkali metals) exclusive of hydrogen, the group 2 (alkaline earth metals), the groups 3 to 7, the groups 8 to 10 (iron family elements and platinum family elements), the group 11 (copper family elements), the group 12 (zinc family elements), the group 13 exclusive of boron, and the group 14 exclusive of carbon and silicon, of the periodic table of elements, and antimony, bismuth, and polonium. Of these, $R^2$ is preferably a silver, gold, copper, aluminum, nickel or palladium atom, and more preferably a silver or copper atom. Incidentally, the foregoing coating solution may contain a metal element likewise the case of the foregoing coating solution.

Specific examples of the compound represented by the foregoing formula (II) include compounds resulting from substituting the group corresponding to $R^1$ in Compounds (1) to (16) as specific examples of the foregoing formula (I) with a metal element. Above all, compounds resulting from substituting the terminal hydrogen atom of the acetylene group of Illustrative Compound (1) with a metal element, in particular, a silver atom, are preferable. Incidentally, in the foregoing formula (I) and formula (II), the bond of $R^1$ or $R^2$ to the acetylene group may be a σ-bond or π-bond.

In the invention, as a solvent that is used in preparing the coating solution containing a metal acetylide, pure water or an organic solvent can be used. In particular, since the metal acetylide contained in the coating solution also has high dispersibility and/or solubility against pure water, the coating solution can be prepared using pure water as the solvent, and environmental safety of the production step is enhanced. Therefore, pure water is preferable.

Examples of the foregoing organic solvent include alcohols such as methanol, ethanol, and isopropyl alcohol; ketones such as acetone and methyl ethyl ketone; halides such as chloroform and methylene chloride; esters such as ethyl acetate; amides such as dimethylacetamide, dimethylformamide, and N-methyl-2-pyrrolidone; nitriles such as acetonitrile; ethers such as diethyl ether and ethyl methyl ether; and acetates such as methoxyethyl acetate and methoxypropyl acetate.

In the foregoing coating solution, it is preferable that the metal acetylide is dissolved or dispersed in the dispersed particle size of not more than 0.1 µm in the solvent. Incidentally, at the time of preparing the foregoing coating solution, in the case where the metal element and the monomer contained in the coating solution react with each other to form a metal acetylide, it is preferable that the formed metal acetylide is dissolved or dispersed in the foregoing dispersed particle size range in the solvent. The coating amount of the metal acetylide is preferably from 50 mg to 20 g, more preferably from 100 mg to 5 g, and especially preferably from 200 mg to 1 g per $m^2$.

In the invention, though the particle-containing layer contains the foregoing particles and metal acetylide as essential components, it can be formed not only in the form of a coating solution thereof together with a solvent such as water as described previously but also in the form of a coating solution thereof having been dispersed in a water-soluble or alkali-soluble resin aqueous solution. Here, examples of the water-soluble or alkali-soluble resin (hereinafter referred to as "water-soluble resin") include polyvinyl alcohol and derivatives thereof, polyvinylpyrrolidone and derivatives thereof, cellulose and derivatives thereof, gelatin and derivatives thereof, and polyacrylic acid and derivatives thereof. They can be used alone or in combinations.

In the invention, in the case where the particle-containing layer is formed by dispersing the particles in the water-soluble resin solution, it is preferable in view of a high adhesive strength to an interlaminar insulating film that a proportion of the foregoing particles to the water-soluble resin is in the range of from 0.5 to 5 (particles/water-soluble resin) in terms of a weight ratio. In view of safety of the water-soluble resin solution having the particles dispersed therein, this ratio is especially preferably not more than 4.

For example, the foregoing particle-dispersed water-soluble resin solution (particle-containing water-soluble resin solution) is in general obtained by adding the particles to an aqueous solution or mixed solution of a solvent (such as methanol) and water having the water-soluble resin dissolved therein, followed by mixing and stirring. The particle-containing water-soluble resin solution can be obtained by strongly stirring or dispersing the particles or agglomerates thereof by a dissolver, a homogenizer, a paint shaker, a Dyno-Mill, etc. to make the particle size of the particles small. Also, the particle-containing water-soluble resin solution can be obtained by stirring a previously prepared particle-dispersed solution and a water-soluble resin. It should not be construed that the preparation method of the particle-dispersed water-soluble resin solution is limited to the foregoing methods. Also, for the sake of coating the particle-dispersed water-soluble resin solution on the support with good surface property, a surfactant may be added, or a mixture of a solvent (such as methanol) and water may be used. Further, for the purpose of preventing sedimentation of the particles, a dispersant or the like can be added.

The foregoing particle-dispersed water-soluble resin solution is, for example, coated on a support (plastic film) by means of bar coating or other means. At this time, it is usually desired that the thickness of the coating film after drying is in the range of from 2 to 15 µm as measured by a film thickness analyzer. When the thickness of the coating film is 2 µm or more, the height of irregularities on the surface of the photosensitive insulating resin layer becomes large, whereby the adhesive strength to the metal plated film is enhanced. Also, when the thickness of the coating film is not more than 15 µm, a proper development time for dissolving or releasing and removing the particle-containing water-soluble resin layer is attained. The thickness of the coating film is especially preferably not more than 10 µm.

In the particle-containing layer to be provided on the support, fine irregularities derived from the particle shape are formed on the surface thereof. Upon heating, the particle-containing layer takes the state in which the organic component contained in the metal acetylide causes heat decomposition and is complicatedly polymerized, whereby the fine metal derived from the metal acetylide is localized in the surface side thereof (film having plating catalytic activity). In the invention, a metal thin film layer is further formed thereon to obtain a conductive film.

As the metal element to be contained in the metal thin film layer, any one of a metal element selected from silver, gold, platinum, copper, aluminum, nickel, palladium, cobalt, and chromium is preferable. Especially, a copper thin film layer is preferable. The metal thin film layer is formed by electroless plating or electrolytic plating. Also, it is preferable that the surface of the metal thin film layer is roughed. Here, in the case where the thickness of the metal thin film layer is thin, since irregularities are similarly formed on the surface of the metal thin film layer along the fine irregularities formed on the surface of the fine metal-containing layer, the surface of the metal thin film layer becomes in the roughed state. In the case where the thickness of the metal thin film layer is thick, the surface roughing treatment is separately carried out by plating or other means.

In the conductive film of the invention, the roughing treatment of the surface of the metal thin film layer is carried out for the purpose of enhancing the adhesive strength between the insulating resin layer and the metal thin film when transferred onto the insulating substrate. In the case where the surface of the water-soluble resin layer is flat, even when a metal plated layer is formed on this water-soluble resin layer, it is easily released so that it is difficult to prepare a circuit substrate by the build-up method.

In the invention, it is necessary to carry out the "roughing" treatment in such a manner that when evaluation is made by a cross-cut adhesion test at intervals of 5 mm according to the method defined in JIS-K5400, at least an eight-point scope is obtained. Accordingly, it is preferable that prior to the release step, a peeling strength as a value obtained by the 90°-peeling test is 0.55 kg/cm or more. Incidentally, in the conductive film of the invention, a step of lowering the strength of the water-soluble resin layer may be taken immediately before the release step.

Next, the method of preparing a conductive film will be described below.

First of all, a coating solution containing particles, a metal acetylide, and optionally a water-soluble resin is prepared. For the purpose of enhancing the dispersibility and/or solubility of the particles and monomer, etc. in the coating solution, a surfactant may be contained in the coating solution. As the surfactant, there are enumerated fluorine based, ammonium salt based, sulfonate based, and ethylene oxide based surfactants. Besides, a binder resin, a plasticizer, a thickening agent, etc. may be contained in the coating solution.

Examples of the surfactant include sodium laurate, sodium doeceylsulfate, sodium 1-octyloxycarbonyl-methyl-1-octyloxycarbonylmethansulfonate, sodium lauryl-naphthalenesulfonate, sodium laurylphosphate, cetyl tri-methylammonium chloride, N-2-ethylpyridinium chloride, polyoxyethylene nonylphenyl ether, polyoxyethylene sorbitan lauryl ester, polyvinyl alcohol, sodium fluoroalkyl-sulfonates, and polyoxyethylene polyfluoroalkyl esters.

Examples of the binder resin include gelatin and derivatives thereof (for example, acylated gelatins such as phthalated gelatin and maleinated gelatin and grafted gelatins resulting from grafting gelatin with acrylic acid, methacrylic acid or an amide thereof), polyvinyl alcohol and derivatives thereof, polyvinylpyrrolidone and derivatives thereof, polyacrylic acid, and polyacrylic acid-diacrylate copolymers.

Examples of the plasticizer include phthalic esters (for example, bis(2-ethylcyclohexyl)phthalate), phosphoric esters (for example, tricresyl phosphate), and fatty acid esters (for example, butyl oleate).

Examples of the thickening agent include carrageenan (i.e., carragheenan, red algae extract, carrageenan, or carragheenin), sodium carboxymethyl cellulose (CMC), guar gum (i.e., guar, guar gum, or guar flour), and pectin.

The foregoing coating solution as prepared is coated on the surface of the support made of a high-molecular film and then heated. At the time of heating, the organic component contained in the metal acetylide is decomposed and further complicatedly polymerized, whereby the fine metal derived from the foregoing metal acetylide is localized on the surface of the surface layer of the water-soluble resin layer. At this time, the fine metal localized on the surface and the water-soluble resin exhibit adhesion to each other due to an extremely high adhesive strength. Incidentally, the localized fine metal may be present as a fine metal-containing layer having a distinct boundary against the particle-containing layer.

The heating temperature is preferably in the range of from 150° C. to 300° C., and more preferably in the range of from 170° C. to 200° C. The heating time is preferably from 10 seconds to 10 minutes, and more preferably from 50 seconds to 5 minutes.

At this point of time, the fine metal to be formed in the surface side has low conductivity unless the molar concentration of the metal salt is especially made high and in general, exhibits a surface resistance value of $105\Omega$/square or more. However, in the case where the metal acetylide is used, especially preferably, silver acetylide is used, it is possible to employ a usual electroless copper plating treatment free from a pre-treatment. Here, the film thickness of electroless plating is usually from 50 nm to 5 µm, preferably from 100 nm to 2 µm, more preferably from 0.15 µm to 1 µm, further preferably from 0.2 µm to 0.8 µm, and most preferably from 0.2 µm to 0.5 µm.

The electroless plating treatment using other metals can be carried out according to the usual method. That is, the surface of a substrate is washed, dipped in a bath containing stannous chloride or other stannous salt, and then washed with water. The resulting substrate is dipped in a bath of a metal salt of promoting deposition of a desired metal (for example, silver nitrate, gold chloride, palladium chloride, and platinum chloride). Next, this metal ion is reduced to form a catalytically activated surface. The resulting substrate is dipped in a liquid of a desired metal salt in the presence of a reducing agent (in general, formaldehyde) to deposit copper, nickel or cobalt.

It is possible to provide the formed surface-localized fine metal or the fine metal-containing layer with conductivity to such extent that electrolytic plating can be performed by an extremely simple method without replying upon the foregoing electroless plating method. That is, the surface-localized fine metal or the fine metal-containing layer may be brought into contact with an acidic solution containing an ion of any one metal element selected from the metal element group consisting of palladium, tin, gold, platinum, and silver and treated therewith by, for example, dipping. By this treatment, the foregoing metal element ion contained in the acidic solution is deposited on the surface of the surface-localized fine metal or the fine metal-containing layer and alloyed with the surface-localized fine metal or the metal in the fine metal-containing layer. As a result, it is possible to make the surface-localized fine metal or the fine metal-containing layer preferably have a surface electrical resistance of not more than 500Ω/square, and more preferably not more than 200Ω/square.

The foregoing acidic solution containing a metal element ion can be prepared by dissolving a metal salt in an acidic solution. Examples of the metal salt to be used include palladium chloride, platinum chloride, and chloroauric acid. Above all, it is preferred to use an acidic solution containing a palladium ion. In particular, in the case where the surface-localized fine metal or the fine metal-containing layer is formed from the metal acetylide, an alloy of silver and palladium is formed, whereby migration to be generated among conductive layer circuits can be reduced.

In the invention, it is preferable from the standpoint of costs that silver acetylide as the metal acetylide is further added with from 50% by mole to 100% by mole of silver nitrate as its metal salt. In this way, the metal concentration can be increased, and the formed surface-localized fine metal or the fine metal-containing layer can be provided with conductivity of from 1 to 10Ω/square upon contact with a hydrohalogenic acid (halogenic acid aqueous solution) or a saturated salt water/sulfuric acid aqueous solution.

After the treatment with the foregoing acidic solution, it is preferred to wash the surface of the surface-localized fine metal or the fine metal-containing layer with pure water or the like. Also, it is preferred to perform drying at from room temperature to 150° C. after washing.

The amount of the metal element contained in the surface-localized fine metal or the fine metal-containing layer after the foregoing treatment with the acidic solution is preferably 0.2 g/m$^2$ or more, and more preferably 0.5 g/m$^2$ or more. When the amount of the metal element falls within the foregoing range, it is possible to lower the surface electrical resistance. Also, the layer thickness of the fine metal-containing layer is preferably from 0.05 μm to 1 μm, and more preferably from 0.1 μm to 0.5 μm. Incidentally, it is possible to regulate the layer thickness of the fine metal-containing layer within the preferred range by adjusting the coating amount of the coating solution.

Also, by not only using a transparent film as the support but also making the surface-localized fine metal or the fine metal-containing layer light transmitting, for example, it is possible to apply the conductive film to members that are required to have light transmission property, such as electromagnetic wave shielding films. By forming the surface-localized fine metal or the fine metal-containing layer using a coating solution (a coating solution to which metal salt particles are not separately added), it is possible to make the surface-localized fine metal or the fine metal-containing layer light transmitting.

In preparing the conductive film of the invention, it is possible to provide the surface-localized fine metal-containing particle layer or the fine metal-containing layer with conductivity by treating with a hydrohalogenic acid or a noble metal salt. It may be probably considered that the metal salt concentration, the metal salt formulation, and the metal form of the surface-localized fine metal-containing particle layer or the fine metal-containing layer change, whereby the conductivity is revealed. In the case where the surface electrical resistance of the layer to which the conductivity has been provided is not more than 500Ω/square, it is possible to easily form a plated (metal thin film) layer on the subject layer under the usual electrolytic plating conditions.

The electrolytic plating treatment can also be carried out according to the usual method. As the metal to be contained in a plating bath, nickel, aluminum, copper, silver, gold, and palladium are preferable. In the case where the conductive film of the embodiment of the invention is applied to a flexible copper-plated laminated board or an electromagnetic wave shielding filter, it is preferred to use a copper plating bath as the plating bath. Examples of the copper plating bath include a copper sulfate bath and a copper pyrophosphate bath. Also, a potassium silver cyamide bath is general as a silver plating bath.

It is preferred to keep the pH of the plating bath at from 8 to 9 and the temperature of the plating bath at the time of the plating treatment at from 50° C. to 70° C., respectively. Also, it is preferable that the plating treatment is carried out at a current density of from 30 to 80 A/dm$^2$. Incidentally, needless to say, the layer thickness of the plated (metal thin film) layer can be adequately set up according to the current value and the plating treatment time at the time of the plating treatment. When applied to a thin film conductive layer for multilayered printed wiring board, the film thickness of the electrolytic plating is usually from 0.5 μm to 50 μm, preferably from 1 μm to 35 μm, and more preferably from 5 μm to 18 μm.

At the time of forming the foregoing electrolytically copper-plated layer, it is preferred to rough the surface by adequately choosing the electrolytic plating conditions and the like. Specifically, by changing the bath formulation, the bath temperature, the current density, the electrolytic time, and so on at the final stage at the time of the formation of an electrolytically copper-plated layer, it is possible to carry out the roughing treatment in such a manner that copper particles having a size of from about 0.2 to 2 μm are deposited as projections on the already formed copper plated surface. When the surface of the electrolytically copper-plated layer is roughed by such a roughing treatment, an adhesive strength to a photosensitive insulating layer (prepreg) to be formed thereon becomes large, and therefore, such is preferable.

As one example of this roughing treatment method, there is enumerated a blackening treatment. Such a blackening treatment is carried out by dipping a copper-plated laminated board in a known blackening solution composed of sodium hydroxide, sodium hypochlorite, sodium phosphate, or the like. As a result of this blackening treatment, the surfaces of the copper foil and through-hole are roughed. This also enhances the adhesion between the copper foil or the like and the prepreg.

The roughed surface of the metal thin film layer in the conductive film of the invention preferably has a ten-point mean surface roughness value (Rz), as defined in JIS B0601, of not more than 4.0 μm, and more preferably in the range of from 2.0 to 4.0 μm. When this Rz value falls within the foregoing range, a sufficient bonding strength to the foregoing photosensitive insulating layer, thereby enabling one to form a fine wiring pattern with high reliability, and therefore, such is preferable.

The foregoing step is not necessarily carried out in a vacuum chamber or the like. In comparison with the preparation step by sputtering, not only the step is simple, but also cheap resin films but not metallic carrier foils such as electrolytic copper foils can be used. Accordingly, it is possible to extremely reduce the production costs of the conductive film. Also, since no adhesive is used, the conductive film of the invention can be used for members that are required to have heat resistance, such as members such as circuit boards.

Since this roughed, electrolytically copper-plated layer is suppressed with respect to oxidation of its surface, it is possible to subject it to rust prevention by zinc, zinc alloy, or chromium based plating. Also, in place of the rust prevention or after the rust prevention, it is possible to coat a photosensitive insulating resin layer described in JP-A-2000-112121.

Figure 2:
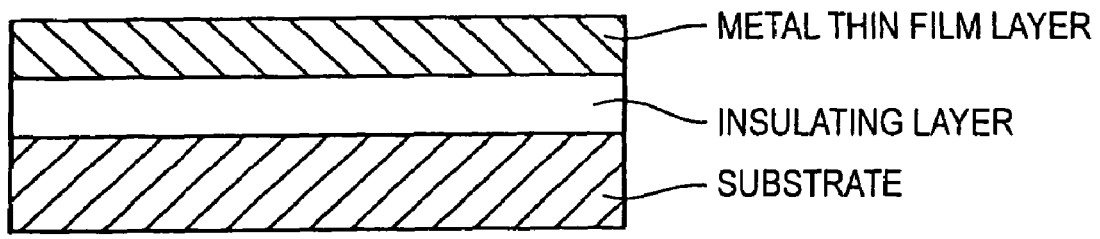
[FIG. 2] is an outline cross-sectional view to schematically show an example of the layer construction of the printed wiring board of the invention.

In the embodiment of the invention, it is possible to supply a circuit board for internal layer of a multilayered printed wiring board. An internal layer circuit is provided on the both of the upper and lower surfaces (or one surface) of this circuit board for internal layer by etching processing of a copper foil. As the circuit board for internal layer, ones prepared by processing a copper foil of a single-sided copper-plated laminated board or double-sided copper-plated laminated board constructed of a substrate portion (insulating material) such as glass cloth base epoxy resins, glass cloth base polyester resins, glass cloth base polyphenylene oxide resins, glass cloth base polyimide resins, and glass cloth base fluorine resins and the copper foil of the invention to form a circuit board for internal layer can be used. Incidentally, an outline cross-sectional view to show an example of the layer construction of the printed wiring board of the invention is shown in FIG. 2.

Not only the embodiment of a short circuit board for internal layer but also a long material can be produced in the following manner. First of all, a long copper foil conductive film of the invention is continuously sent and superposed on one side of a single sheet or plural sheets of a resin-impregnated base comprising a sheet-shaped base such as glass cloths impregnated in a resin composition to be continuously sent, while sending a long release film on the other side thereof, and passed through a heat curing furnace to prepare a long single-sided copper-plated laminated board in which the copper foil is adhered to one side of an insulating material composed of a cured material of the sheet-shaped base and the resin composition by the continuous process.

As the resin composition to be impregnated in the sheet-shaped base such as glass cloths, resin compositions prepared by diluting an unsaturated bond-containing resin such as unsaturated polyester resins, diallyl phthalate resins, and vinyl ester resins with a vinyl monomer, etc. which will become a crosslinking agent and adding a polymerization initiator thereto can be used. Further, resin compositions comprising a solventless epoxy resin having a curing agent or a curing accelerator compounded therein can be used. Still further, resin compositions to which is optionally added an inorganic powdered filler such as talc, clay, calcium carbonate, aluminum hydroxide, and silica, or a fibrous filler such as glass fibers can be used.

These resin compositions are a resin composition suitable for the production of a copper-plated laminated board by the continuous process because a volatile matter such as condensed water is not formed. Incidentally, as the long material, ones prepared by laminating a long prepreg, a long copper foil conductive film, and a long release film and then releasing the long release film can be used.

Also, as the foregoing release film, films such as PET, polyimides, polyvinylidene chloride, and fluorine resins can be used. In this embodiment, the release film in which the surface thereof to be brought into contact with the resin-impregnated base is roughed is used. Accordingly, the surface of the insulating material of the single-sided copper-plated laminated board obtained by passing through the heat curing furnace and curing is formed as a roughed surface by transferring the fine irregularities of the rough surface formed on the release film. On the surface of the insulating material of the single-sided copper-plated laminated board (the surface from which the release film has been released), a curable adhesive layer composed of, for example, an epoxy resin is formed. As the adhesive to be used for forming the curable adhesive layer, one having such properties that when it is temporarily heated at from 80 to 200° C. for from 3 to 20 minutes, it becomes in the semi-cured state so that the surface does not become sticky, and when it is again heated and melted at from 80 to 150° C. and further heated at from 150 to 200° C., it is completely cured is desirable.

With respect to the formation of the adhesive layer on the surface of the insulating material of the single-sided copper-plated laminated board, for example, an adhesive is coated on the surface of the insulating material of the single-sided copper-plated laminated board by roll coating, curtain coating or other means and temporarily heated into the semi-cured state, whereby the adhesive layer can be uniformly formed in a desired thickness. When the adhesive layer in the semi-cured state has a thickness of from 20 to 100 µm, it is possible to form an adhesive layer having a uniform thickness without causing void deficiency, and therefore, such is preferable. In this way, it is possible to obtain a long material in the rolled state, in which the adhesive layer is formed on the surface of the insulating material of the single-sided copper-plated laminated board. Since the adhesive layer may be formed only on single-sided (surface of the insulating material) of the single-sided copper-plated laminated board, there is brought an advantage that the step management is easy in comparison with the case of forming the adhesive layer on the both surfaces.

EXAMPLES

The effects of the invention will be made clear with reference to the following Examples, but it should not be construed that the invention is limited to these Examples. Incidentally, the term "part" means "part by weight".

Example 1

[Case 1] Preparation of Conductive Film 10-A:

(1-1) Preparation of Metal Acetylide (Silver Salt of Illustrative Compound (1)):

A silver salt of the foregoing Illustrative Compound (1) shown as a specific example of the formula (I) was prepared in the following method.

16.4 g of sodium acetate and 16.7 g of silver nitrate were suspended in 200 mL of distilled water at 40° C. in the light-shielded state. 20.1 g of Illustrative Compound (1) was added dropwise to the suspension, and after stirring for 20 minutes, the mixture was cooled to room temperature. The reaction mixture was neutralized with 7.8 g of sodium hydrogencarbonate, and a supernatant was removed by decantation. Further, 200 mL of distilled water and 400 mL of chloroform were added for extraction. The chloroform layer was dried over anhydrous sodium sulfate, and the chloroform was distilled off in vacuo to obtain 29 g (substantially quantitatively) of a white wax-like solid. It was confirmed from NMR spectrum and IR spectrum that this substance was a σ-complex of silver acetylide represented by the following structural formula 1.

Structural Formula 1

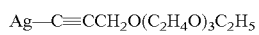

NMR: δ1.15 (triplet, 3H), 3.0 to 40 (multiplet, 14H), 3.4 (broad singlet, 2H)

IR: 2,860 cm$^{-1}$ (C—H stretched), 1,980 cm$^{-1}$ (C≡C stretched), 1,100 cm$^{-1}$ (C—O stretched)

0.24 g of a silver salt of Illustrative Compound (1), 0.36 g of distilled water, and 1.80 g of methanol were mixed and dissolved to prepare a solution having a concentration of 10% by weight. This solution was coated on a polyethylene terephthalate substrate by spin coating and heated in an oven at 200° C. for 3 minutes. In this way, a water-insoluble pale brown transparent thin film was prepared. This thin film had a thickness of 0.1 μm, and uniform silver grains having a size of from 5 to 50 nm were dispersed therein. Also, it was confirmed by the analysis according to the X-ray photoelectron spectroscopy (XPS) that a silver element was unevenly distributed in the vicinity of the surface (up to 50 nm).

(1-2) Preparation of Conductive Film 10-A:

Preparation of Coating Solution a for Metallic Catalyst Layer:

A coating solution a for metallic catalyst layer having the following formulation was prepared.

| | |
|---|---|
| Metal acetylide (compound represented by the foregoing structural formula 1 as obtained in Case 1): | 15 parts |
| Finely divided dispersion (50 g of calcium carbonate particles (mean particle size: 4.4 μm; Tunex E, manufactured by Shiraishi Kogyo Kaisha, Ltd.) and 50 g of ion-exchanged water were mixed and dispersed for 30 minutes by a paint shaker): | 15 parts |
| Surfactant (nonionic fluorine based surfactant): | 0.1 parts |
| Pure water: | 70 parts |

Preparation of Direct Electroless Copper-Plated Film:

The foregoing coating solution a for metallic catalyst layer was coated on a polyimide resin film (thickness: 50 μm, short-term heat resistant temperature: 420° C.) in a dry film thickness of 0.5 μm using a bar coater. Next, the resulting film was heat treated at 185° C. for 5 minutes to prepare a film in which a metallic silver catalyst layer having fine surface irregularities was formed. At this point of time, the surface was microscopically observed. As a result, the surface became a roughed surface in which finely divided projections were formed over the whole surface. The resulting surface had a ten-point mean surface roughness (Rz) of 4.4 μm.

This film was dipped directly in an electroless copper plating liquid (Melplate CU-390, manufactured by Meltex Inc.) for 20 minutes under the condition of at 25° C. and a pH of 12.8 without subjecting to a usual catalytic activation treatment and after washing with pure water for 5 minutes, dried at 100° C. for 15 minutes. As a result, an electroless copper-plated film having a film thickness of 0.3 μm was formed on the particle-containing layer. The resulting surface had a ten-point mean surface roughness (Rz) of 3.7 μm.

Preparation of Conductive Film 10-A (Electrolytically Copper-Plated Film):

The thus obtained electroless copper-plated film was dipped in a degreasing agent (PC455) manufactured by Meltex Inc. at 25° C. for 30 seconds and after washing with water for 2 minutes, subjected to an electrolytic copper plating treatment. The electrolytic copper plating liquid had a formulation made of 75 g/L of copper sulfate, 190 g/L of sulfuric acid, about 50 ppm of a chlorine ion, and 5 mL/L of Cover Gleam PCM, manufactured by Meltex Inc., and the plating treatment was carried out using this electrolytic copper plating liquid under the condition at 25° C. and 2.4 A/100 cm$^2$ for 15 minutes. As a result, about 7 μm of copper was deposited. Next, the resulting plated layer-containing substrate was placed in an oven and subjected to an annealing treatment by standing at 170° C. for 60 minutes. The resulting surface had a ten-point mean surface roughness (Rz) of 3.0 μm.

[Case 2] Preparation of Conductive Film 20-B:

A coating solution a for metallic catalyst layer was prepared in the same operation as in Case 1 and coated on a polyimide resin film (thickness: 50 μm, short-term heat resistant temperature: 420° C.) in a dry film thickness of 0.5 μm using a bar coater. Next, the resulting film was heat treated at 185° C. for 5 minutes to prepare a film in which a metallic silver catalyst layer having fine surface irregularities was formed. This film was dipped in a 1N hydrochloric acid aqueous solution having 500 ppm of palladium chloride dissolved therein for 40 seconds and after washing with water, dried at 100° C. for one hour. The resulting surface had a ten-point mean surface roughness (Rz) of 3.9 μm.

This film was directly subjected to an electrolytic copper plating treatment without subjecting to an electroless copper plating treatment. Similar to Case 1, the electrolytic copper plating liquid had a formulation made of 75 g/L of copper sulfate, 190 g/L of sulfuric acid, about 50 ppm of a chlorine ion, and 5 mL/L of Cover Gleam PCM, manufactured by Meltex Inc., and the plating treatment was carried out using this electrolytic copper plating liquid under the condition at 25° C. and 2.4 A/100 cm$^2$ for 20 minutes. As a result, about 7 μm of copper was deposited. Next, the resulting plated layer-containing substrate was placed in an oven and subjected to an annealing treatment by standing at 170° C. for 60 minutes. The resulting surface had a ten-point mean surface roughness (Rz) of 2.6 μm.

[Case 3] Preparation of Conductive Film 10-C:

Preparation of Coating Solution B for Metallic Catalyst Layer:

A coating solution b for metallic catalyst layer having the following formulation was prepared.

| | |
|---|---|
| Polyvinyl alcohol (10% by weight aqueous solution: PVA205, manufactured by Kuraray Co., Ltd.): | 32.5 parts by weight |
| Polyvinylpyrrolidone (10% by weight aqueous solution: K905, manufactured by Shin-Etsu Chemical Co., Ltd.): | 13.8 parts by weight |
| Hydroxymethyl cellulose (5% by weight aqueous solution: TC5E, manufactured by Gokyo Trading Co., Ltd.): | 65.0 parts by weight |
| Metal acetylide (compound represented by the foregoing structural formula 1 as obtained in Case 1): | 38.8 parts by weight |
| Finely divided dispersion (the same as in Case 2): | 59.4 parts by weight |
| Surfactant (30% by weight solution: Surflon S131, manufactured by Asahi Glass Co., Ltd.): | 0.65 parts by weight |
| Ion-exchanged water: | 40.0 parts by weight |

Preparation of Direct Electroless Copper-Plated Film:

The coating solution b for foregoing metallic catalyst layer was coated on a polyimide resin film (thickness: 50 μm, short-term heat resistant temperature: 420° C.) in a dry film thickness of 0.5 μm using a bar coater. Next, the resulting film was heat treated at 185° C. for 5 minutes to prepare a film in which a metallic silver catalyst layer having fine surface irregularities was formed. At this point of time, the surface was microscopically observed. As a result, the surface became a roughed surface in which finely divided projections were formed over the whole surface. The resulting surface had a ten-point mean surface roughness (Rz) of 4.0 μm.

This film was dipped directly in an electroless copper plating liquid (Melplate CU-390, manufactured by Meltex Inc.) for 20 minutes under the condition of at 25° C. and a pH of 12.8 without subjecting to a usual catalytic activation treatment and after washing with pure water for 5 minutes, dried at 100° C. for 15 minutes. As a result, an electroless copper-plated film having a film thickness of 0.3 μm was formed on the particle-containing layer. The resulting surface had a ten-point mean surface roughness (Rz) of 3.2 μm.

Preparation of Conductive Film 10-C (Electrolytically Copper-Plated Film):

The thus obtained electroless copper-plated film was dipped in a degreasing agent (PC455) manufactured by Meltex Inc. at 25° C. for 30 seconds and after washing with water for 2 minutes, subjected to an electrolytic copper plating treatment. The electrolytic copper plating liquid had a formulation made of 75 g/L of copper sulfate, 190 g/L of sulfuric acid, about 50 ppm of a chlorine ion, and 5 mL/L of Cover Gleam PCM, manufactured by Meltex Inc., and the plating treatment was carried out using this electrolytic copper plating liquid under the condition at 25° C. and 2.4 A/100 cm$^2$ for 15 minutes. As a result, about 7 μm of copper was deposited. Next, the resulting plated layer-containing substrate was placed in an oven and subjected to an annealing treatment by standing at 170° C. for 60 minutes. The resulting surface had a ten-point mean surface roughness (Rz) of 2.1 μm.

[Case 4] Preparation of Conductive Film 20-D:

A coating solution a for metallic catalyst layer was prepared in the same operation as in Case 1 and coated on a polyethylene terephthalate resin film (thickness: 50 μm, short-term heat resistant temperature: 210° C.) in a dry film thickness of 0.5 μm using a bar coater. Next, the resulting film was heat treated at 185° C. for 5 minutes to prepare a film in which a metallic silver catalyst layer having fine surface irregularities was formed. This film was dipped in a 1N hydrochloric acid aqueous solution having 500 ppm of palladium chloride dissolved therein for 40 seconds and after washing with water, dried at 100° C. for one hour. The resulting surface had a ten-point mean surface roughness (Rz) of 3.6 μm.

This film was directly subjected to an electrolytic copper plating treatment without subjecting to an electroless copper plating treatment. Similar to Case 1, the electrolytic copper plating liquid had a formulation made of 75 g/L of copper sulfate, 190 g/L of sulfuric acid, about 50 ppm of a chlorine ion, and 5 mL/L of Cover Gleam PCM, manufactured by Meltex Inc., and the plating treatment was carried out using this electrolytic copper plating liquid under the condition at 25° C. and 2.4 A/100 cm$^2$ for 20 minutes. As a result, about 7 μm of copper was deposited. Next, the resulting plated layer-containing substrate was placed in an oven and subjected to an annealing treatment by standing at 170° C. for 60 minutes. The resulting surface had a ten-point mean surface roughness (Rz) of 2.5 am.

[Comparative Case 1] Preparation of conductive film E:
Preparation of Coating Solution C for Metallic Catalyst Layer:

A coating solution c for metallic catalyst layer having the following formulation was prepared.

| | |
|---|---|
| Polyvinyl alcohol (10% by weight aqueous solution: PVA205, manufactured by Kuraray Co., Ltd.): | 42.5 parts by weight |
| Polyvinylpyrrolidone (10% by weight aqueous solution: K905, manufactured by Shin-Etsu Chemical Co., Ltd.): | 23.8 parts by weight |
| Hydroxymethyl cellulose (5% by weight aqueous solution: TC5E, manufactured by Gokyo Trading Co., Ltd.): | 75.0 parts by weight |
| Metal acetylide (compound represented by the foregoing structural formula 1 as obtained in Case 1): | 48.8 parts by weight |
| Surfactant (30% by weight solution: Surflon S131, manufactured by Asahi Glass Co., Ltd.): | 0.65 parts by weight |
| Ion-exchanged water: | 50.0 parts by weight |

Preparation of Direct Electroless Copper-Plated Film:

The coating solution c for foregoing metallic catalyst layer was coated on a polyimide resin film (thickness: 50 μm, short-term heat resistant temperature: 420° C.) in a dry film thickness of 0.5 μm using a bar coater. Next, the resulting film was heat treated at 185° C. for 5 minutes to prepare a film in which a metallic silver catalyst layer having silver mirror gloss was formed. At this point of time, the resulting surface had a ten-point mean surface roughness (Rz) of 0.4 μm.

This film was dipped directly in an electroless copper plating liquid (Melplate CU-390, manufactured by Meltex Inc.) for 20 minutes under the condition of at 25° C. and a pH of 12.8 without subjecting to a usual catalytic activation treatment and after washing with pure water for 5 minutes, dried at 100° C. for 15 minutes. As a result, an electroless copper-plated film having a film thickness of 0.3 μm was formed on the particle-containing layer. The resulting surface had a ten-point mean surface roughness (Rz) of 0.2 μm.

Preparation of Conductive Film E (Electrolytically Copper-Plated Film):

The thus obtained electroless copper-plated film was dipped in a degreasing agent (PC455) manufactured by Meltex Inc. at 25° C. for 30 seconds and after washing with water for 2 minutes, subjected to an electrolytic copper plating treatment. The electrolytic copper plating liquid had a formulation made of 75 g/L of copper sulfate, 190 g/L of sulfuric acid, about 50 ppm of a chlorine ion, and 5 mL/L of Cover Gleam PCM, manufactured by Meltex Inc., and the plating treatment was carried out using this electrolytic copper plating liquid under the condition at 25° C. and 2.4 A/100 cm$^2$ for 15 minutes. As a result, about 7 μm of copper was deposited.

Next, the resulting plated layer-containing substrate was placed in an oven and subjected to an annealing treatment by standing at 170° C. for 60 minutes. The resulting surface had a ten-point mean surface roughness (Rz) of 1.2 μm. However, at this point of time, a portion where the copper foil had been partly released from the resin layer was observed.

Example 2

Production of Single-Sided Copper-Plated Laminated Board and Evaluation of its Characteristics Each of the five kinds of the conductive films 10-A, 20-B, 10-C and 20-D prepared in the foregoing Cases 1 to 4 and the conductive film E prepared in the foregoing Comparative Case 1 was cut into a size of 300 mm (MD)×300 (TD), and the surface of the copper foil layer side was placed on a glass fiber epoxy prepreg sheet (FR-4) having a thickness of 1 mm. The whole was sandwiched by two sheets of a smooth stainless steel plate and subjected to thermo-compression bonding at a temperature of 170° C. under a pressure of 50 kg/cm² for 60 minutes. Next, the polyimide or polyethylene terephthalate as the support before the thermo-compression bonding was released using an adhesive sheet. With respect to the former four conductive films, the release interface was an interface between the support and the water-soluble resin layer. On the other hand, with respect to the conductive film E, release took place at the interface between the plated copper foil and the water-soluble resin layer, and a completely smooth transfer performance of the copper foil was feared.

Next, each of the single-sided copper-plated laminated boards was shower washed at 40° C. for 30 seconds using a 0.5% by weight sodium carbonate aqueous solution, thereby removing the water-soluble resin layer on the copper foil surface. The substrate was cut into a width of 100 mm and subjected to a 90°-peeling test using a Tensilon tensile tester to measure a peeling strength. As a result, the former four conductive films of the invention had a peeling strength of 0.6 kg/cm or more and exhibited good adhesion. On the other hand, the conductive film E had a peeling strength of not more than 0.2 kg/cm and exhibited low adhesion. The results are shown in Table 1.

TABLE 1

|  | Conductive film | | | | |
| --- | --- | --- | --- | --- | --- |
|  | 10-A | 20-B | 10-C | 20-D | E |
| Peeling strength (kg/cm) | 0.75 | 0.68 | 0.67 | 0.88 | 0.17 |

Example 3

Production of Double-Sided Copper-Plated Laminated Board

With respect to the four kinds of the conductive films 10-A, 20-B, 10-C and 20-D prepared in the foregoing Cases 1 to 4, the respective two sheets were cut into a size of 300 mm (MD)×300 (TD), and a glass fiberepoxy prepreg sheet (FR-4) having a thickness of 1 mm was sandwiched by the both surfaces of the copper foil layer sides. The whole was further sandwiched by two sheets of a smooth stainless steel plate from the outside and subjected to thermo-compression bonding at a temperature of 170° C. under a pressure of 50 kg/cm² for 60 minutes in the same manner as in Example 2. Next, the polyimide or polyethylene terephthalate as the support before the thermo-compression bonding was released using an adhesive sheet, and the released interface was shower washed at 40° C. for 30 seconds using a 0.5% by weight sodium carbonate aqueous solution, thereby removing the water-soluble resin layer on the copper foil surface. The substrate was cut into a width of 100 mm and subjected to a 90'-peeling test using a Tensilon tensile tester to measure a peeling strength. As a result, the double-sided copper-plated laminated boards of the invention had a peeling strength of 0.6 kg/cm or more and exhibited good adhesion.

Example 4

Production of Multilayered Printed Wiring Board

A photosensitive film was laminated on the both surfaces of each of the double-sided copper-plated laminated boards produced in the foregoing Example 3 based on the conductive film 10-A. Each of the photosensitive films was exposed and developed into a prescribed pattern, and the copper foil was etched to form a circuit pattern. Next, the exposed area of each of the double-sided copper-plated laminated boards was subjected to a blackening treatment, and a curable adhesive layer made of an epoxy resin was formed in a thickness of 100 μm on the both surfaces of the laminated board by roll coating. The adhesive layer was heated at 70° C. to become in the semi-cured state, and the conductive film 10-A was sandwiched from the both sides. Further, the whole was sandwiched by two sheets of a smooth stainless steel plate from the outside and subjected to thermo-compression bonding at a temperature of 170° C. under a pressure of 50 kg/cm² for 60 minutes in the same manner as in Example 2. Next, the polyimide or polyethylene terephthalate as the support before the thermo-compression bonding was released using an adhesive sheet, and the released interface was shower washed at 40° C. for 30 seconds using a 0.5% by weight sodium carbonate aqueous solution, thereby removing the water-soluble resin layer on the copper foil surface. The substrate was cut into a width of 100 mm and subjected to a 90°-peeling test using a Tensilon tensile tester to measure a peeling strength. As a result, the multilayered printed wiring boards of the invention had a peeling strength of 0.6 kg/cm or more and exhibited good adhesion.

This application is based on Japanese Patent application JP 2003-286837, filed Aug. 5, 2003, the entire content of which is hereby incorporated by reference, the same as if set forth at length.

What is claimed is:

1. A conductive film comprising: a support; a particle-containing layer; and a metal thin film layer, in this order, wherein the particle-containing layer contains particles having a mean particle size of from 1 to 10 μm and a heat decomposed material of a metal acetylide and has irregularities derived from a shape of the particles formed on a surface thereof, and the metal thin film layer contains a metal element.

2. The conductive film according to claim 1, wherein the particle-containing layer further contains water and a water-soluble or alkali-soluble resin.

3. The conductive film according to claim 1, wherein the metal thin film layer is formed by electroless plating or electrolytic plating.

4. The conductive film according to claim 1, wherein the metal element contained in the metal thin film layer is one metal element selected from the group consisting of silver, gold, platinum, copper, aluminum, nickel, palladium, cobalt, and chromium.

5. The conductive film according to claim 1, wherein the metal element contained in the metal thin film layer is copper.

6. The conductive film according to claim 1, wherein the metal acetylide is a compound obtained by reaction of a compound represented by the following formula (I) and a metal element:

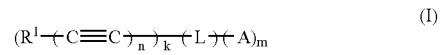

wherein A represents a polyoxyether group, a polyaminoether group, or a polythioether group; $R^1$ represents a hydrogen atom, a carboxyl group or a salt thereof, an alkyl group, a cycloalkyl group, an alkenyl group, an alkynyl group, an aryl group, an aralkyl group, or a heterocyclic group; L represents a chemical bond of connecting a carbon-carbon triple bond to A or a group having a (k+m) valence; k and n each presents an integer of 1 or more; and m represents an integer of 0 or more.

7. The conductive film according to claim 1, wherein the support has a short-term heat resistant temperature of 150° C. or higher.

8. The conductive film according to claim 1, wherein the support contains polyethylene terephthalate.

9. The conductive film according to claim 1, wherein a surface of the metal thin film layer is roughed.

10. A film having plating catalytic activity, comprising a support and a particle-containing layer, the particle-containing layer containing at least particles having a mean particle size of from 1 to 10 μm and a heat decomposed material of a metal acetylide and having irregularities derived from a shape of the particles formed on a surface thereof, wherein a fine metal derived from the metal acetylide is localized in a surface side of the particle-containing layer.

11. The film having plating catalytic activity according to claim 10, wherein the localized fine metal is silver.

* * * * *